United States Patent
Yoshida

(10) Patent No.: US 11,833,719 B2
(45) Date of Patent: Dec. 5, 2023

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventor: Kenji Yoshida, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 17/075,554

(22) Filed: Oct. 20, 2020

(65) Prior Publication Data
US 2021/0122089 A1    Apr. 29, 2021

(30) Foreign Application Priority Data
Oct. 25, 2019   (JP) .................. 2019-194555

(51) Int. Cl.
G03F 7/00      (2006.01)
B29C 35/02     (2006.01)
B29C 35/08     (2006.01)
B29C 59/02     (2006.01)

(52) U.S. Cl.
CPC ...... B29C 35/0288 (2013.01); B29C 35/0805 (2013.01); B29C 59/02 (2013.01); *B29C 2035/0827* (2013.01)

(58) Field of Classification Search
CPC .... G03F 7/2055; G03F 7/2059; G03F 7/2053; G03F 7/2045; G03F 7/70016; G03F 7/70025; G03F 7/201; G03F 7/0002; G03F 7/7005; G03F 7/2012; B29C 2035/00; B29C 35/00; B29C 35/0288
See application file for complete search history.

(56) References Cited

U.S. PATENT DOCUMENTS

| 2014/0027955 A1* | 1/2014 | Wakabayashi ............ G03F 7/00 264/447 |
| 2016/0001492 A1* | 1/2016 | Yamaguchi ........... B29C 33/424 425/225 |
| 2017/0144363 A1* | 5/2017 | Nakagawa ............ G03F 7/0002 |

(Continued)

FOREIGN PATENT DOCUMENTS

| JP | 2013038117 A | 2/2013 |
| JP | 2019-106536 A | 6/2019 |
| JP | 2019-125656 A | 7/2019 |

*Primary Examiner* — S. Behrooz Ghorishi
*Assistant Examiner* — John W Hatch
(74) *Attorney, Agent, or Firm* — Canon U.S.A., Inc. I.P. Division

(57) ABSTRACT

An imprint apparatus that performs an imprint process for bringing a protruding portion of a mold into contact with a composition on a substrate is provided. The apparatus comprises a first illuminator configured to emit light for curing the composition, a second illuminator including a scanner configured to scan beam-like light for curing the composition, and a controller configured to control exposure such that in a state where the composition and the protruding portion are in contact with each other, the light from the first illuminator is emitted to the composition at a position corresponding to a first region of the protruding portion, and control the scanner such that the light from the second illuminator is emitted to the composition at a position corresponding to a second region different from the first region of the protruding portion.

12 Claims, 10 Drawing Sheets

(56) References Cited

U.S. PATENT DOCUMENTS

2019/0086796 A1\* 3/2019 Murasato ............ G02B 27/0961
2019/0113847 A1\* 4/2019 Ahn ...................... G03F 7/2051
2021/0187797 A1\* 6/2021 Koide .................... B29C 35/08

\* cited by examiner

A-A' CROSS SECTION

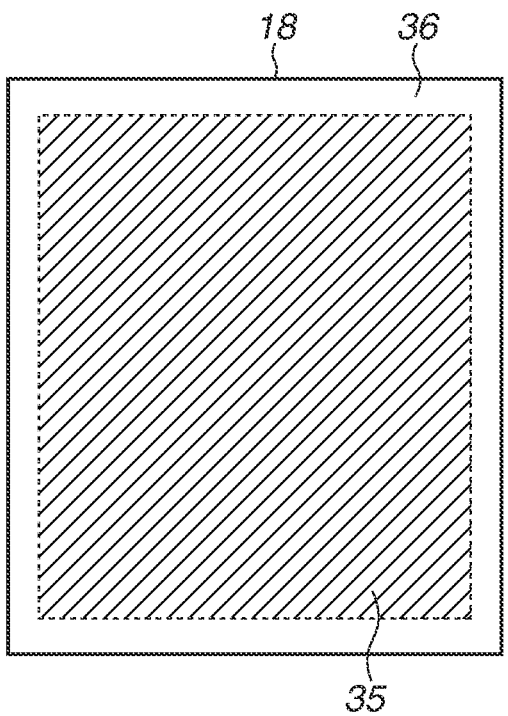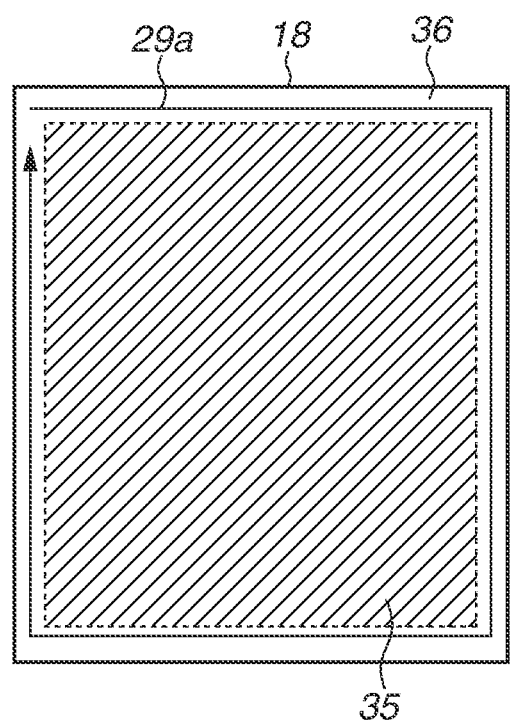

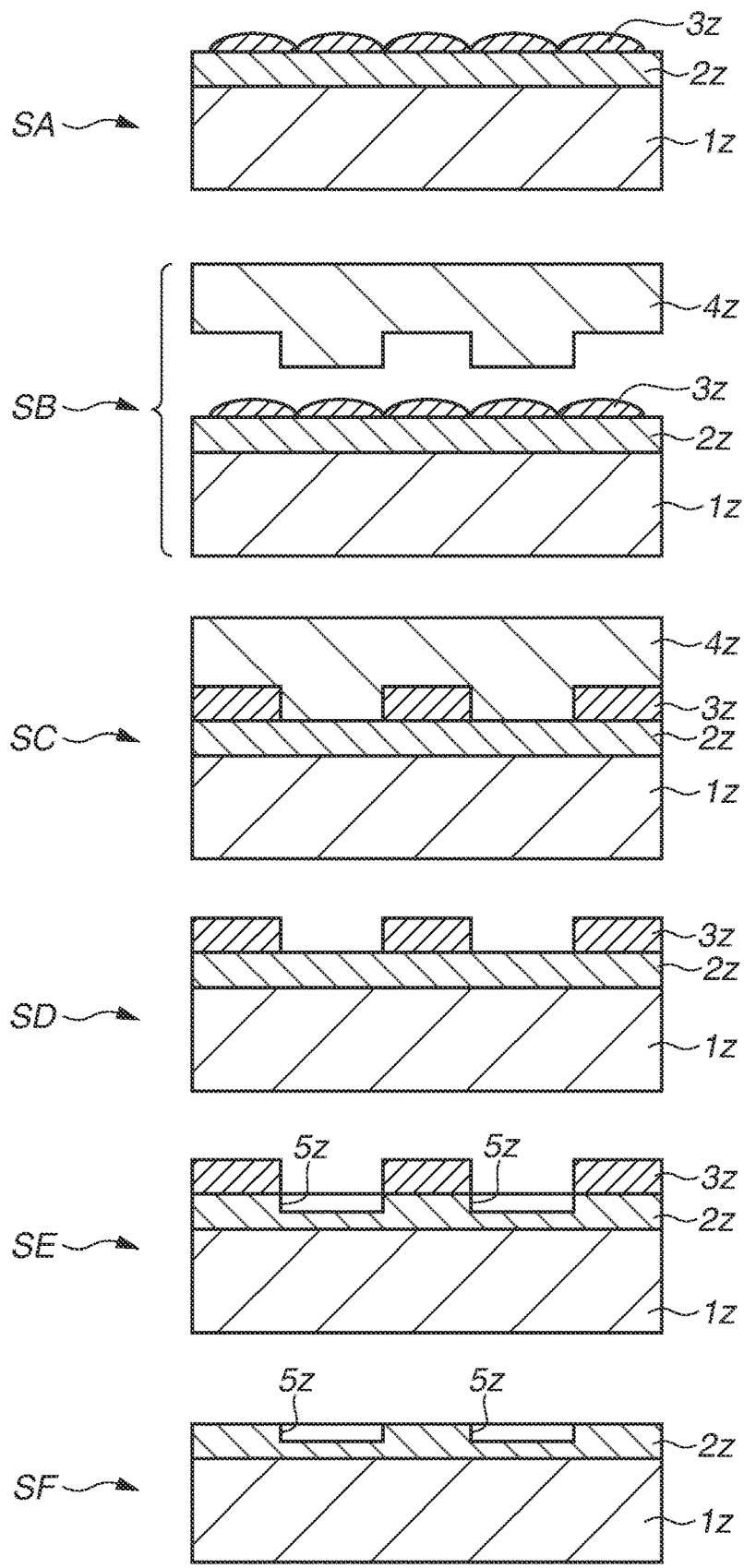

IMPRINT APPARATUS, IMPRINT METHOD, AND METHOD FOR MANUFACTURING ARTICLE

BACKGROUND

Field of the Disclosure

The present disclosure relates to an imprint apparatus, an imprint method, and a method for manufacturing an article.

Description of the Related Art

Miniaturization of a semiconductor device and microelectromechanical systems (MEMS) is increasingly required, and in addition to a conventional photolithography technique, an imprint technique capable of forming a minute pattern (feature) on the order of several nanometers is getting attention. The imprint technique is a microfabrication technique for supplying (applying) an uncured imprint material onto a substrate and bringing the imprint material and a mold (a template) into contact with each other, thereby forming on the substrate the pattern of the imprint material corresponding to a minute uneven pattern formed on the mold.

In the imprint technique, one of curing methods for curing the imprint material is a light curing method. The light curing method is a method for forming a pattern as follows. In a state where an imprint material supplied onto a shot region on a substrate and a pattern region on a mold are in contact with each other, the imprint material is irradiated with, for example, ultraviolet (UV) light, thereby curing the imprint material.

In such an imprint apparatus, the imprint material and the mold are brought into contact with each other by applying a pressing force to fill every minute portion of a pattern provided in a protruding portion (a mesa portion) of a mold with an imprint material. If the pressing force is applied, however, the imprint material may stick out to the outside of the protruding portion and become attached to a side surface of the protruding portion. If the imprint material thus attached to the side surface is irradiated with UV light and cures, the cured imprint material may fall onto a substrate and become a foreign substance. This may cause a pattern failure or the breakage of the mold.

There is also an imprint process being discussed for applying an imprint material onto the entire surface of a substrate in advance and then repeatedly pressing a protruding portion while shifting the position of the protruding portion. In such an imprint process, if a part of an imprint material other than a part of the imprint material with which a protruding portion is in contact is irradiated with UV light, the irradiated part of the imprint material may already be cured when the protruding portion is pressed next, and a pattern may not be able to be properly formed.

Japanese Patent Laid-Open No. 2013-38117 discusses a technique for providing a mask plate that limits an irradiation region of UV light emitted to a mold and placing a transmission region of UV light inside a protruding portion using the mask plate, thereby preventing the emission of UV light to outside a target region.

In a method for preventing the emission of UV light to outside a region of a protruding portion using a mask plate as discussed in Japanese Patent Laid-Open No. 2013-38117, a shape of the protruding portion and a shape of a UV transmission region limited by the mask plate need to be the same. The shape of a protruding portion of a mold, however, may change depending on a type of an article to be manufactured or a manufacturing step. Thus, every time the shape of the protruding portion changes, a mask plate (a masking blade) according to the shape of the protruding portion needs to be provided, which is not realistic.

SUMMARY

The present disclosure is directed to providing an imprint apparatus that, even if the shape of a protruding portion changes, for example, due to a change of a mold, prevents the emission of ultraviolet light to outside the protruding portion.

The present invention in its one aspect provides an imprint apparatus using a mold including a protruding portion protruding from a base portion to perform an imprint process for bringing the protruding portion into contact with a composition on a substrate, the imprint apparatus comprising a mold holder configured to hold the mold, a substrate holder configured to hold the substrate onto which the composition is supplied, a driver configured to drive at least one of the substrate and the mold so that the protruding portion of the mold is in contact with the composition on the substrate, a first illuminator configured to emit light for curing the composition, a second illuminator including a scanner configured to scan beam-like light for curing the composition, and a controller configured to, in a state where the composition and the protruding portion are in contact with each other, control exposure such that the light from the first illuminator is emitted to the composition at a position corresponding to a first region of the protruding portion, and control the scanner such that the light from the second illuminator is emitted to the composition at a position corresponding to a second region different from the first region of the protruding portion.

Further features of the present invention will become apparent from the following description of exemplary embodiments with reference to the attached drawings.

BRIEF DESCRIPTION OF THE DRAWINGS

FIG. 6A is a diagram illustrating an irradiation region for collective exposure and an irradiation region for scanning exposure in the pattern region illustrated in FIG. 2A. FIG. 6B is a diagram illustrating a state of the scanning exposure.

FIG. 10 is a diagram illustrating a flow of a process for forming a pattern on a substrate using an imprint apparatus, and manufacturing an article.

DESCRIPTION OF THE EMBODIMENTS

Figure 1:
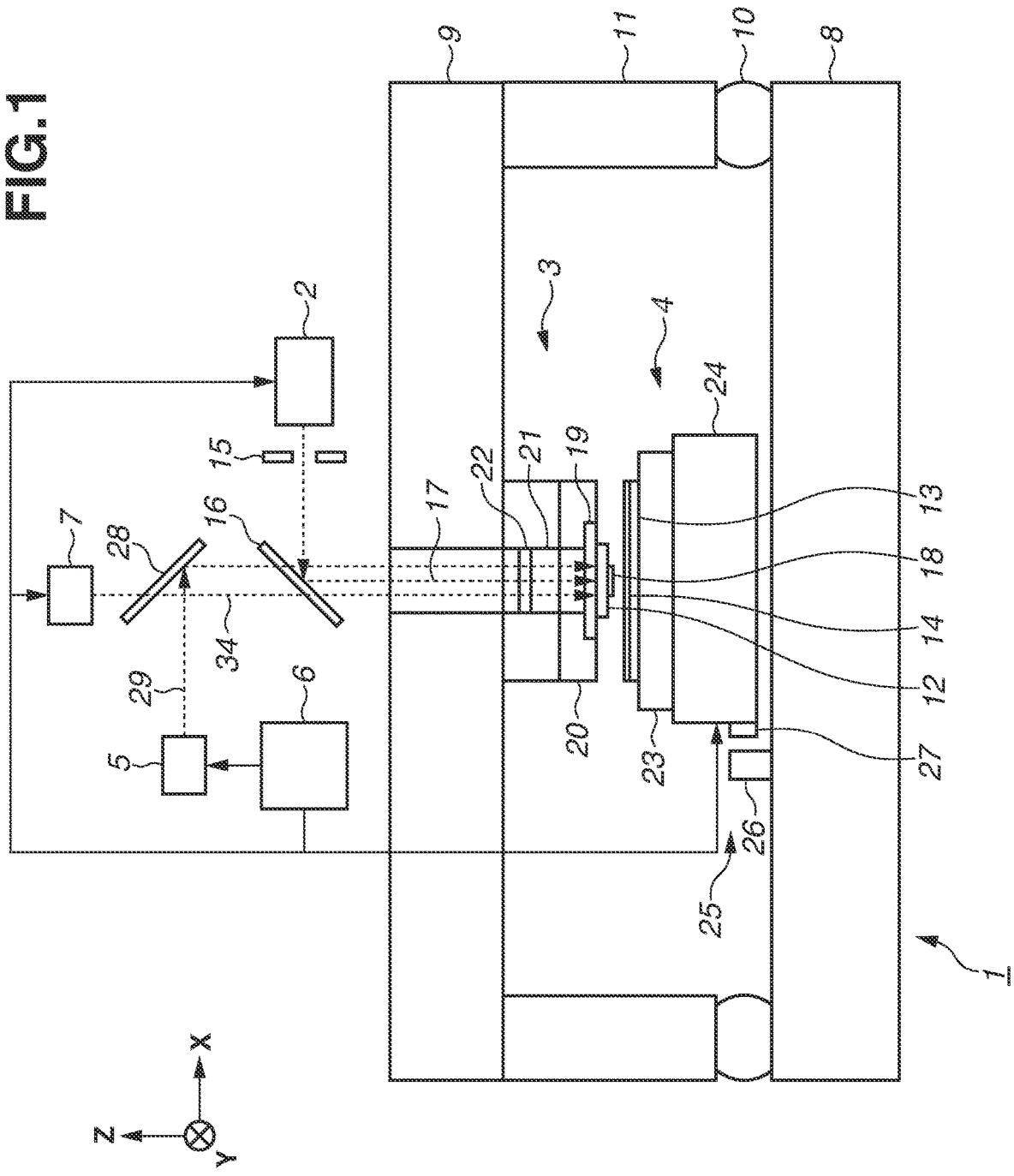
FIG. 1 is a block diagram illustrating a configuration of an imprint apparatus according to the present invention.

With reference to the attached drawings, suitable exemplary embodiments of the present disclosure will be described below. In the drawings, similar members are designated by the same reference numbers, and are not redundantly described.

FIG. 1 is a block diagram illustrating a configuration of an imprint apparatus 1 according to a first exemplary embodiment as an aspect of the present invention. The imprint apparatus 1 is a lithography apparatus to manufacture a device, such as a semiconductor device as an article, and perform an imprint process for forming a pattern of an imprint material (also referred to as a "composition") on a substrate using a mold. In the present exemplary embodiment, the imprint apparatus 1 brings an imprint material supplied onto a substrate and a mold into contact with each other and gives curing energy to the imprint material, and thereby can form a pattern of a cured product to which an uneven pattern of the mold is transferred.

As the imprint material, a curable composition is used. The curable composition (also occasionally referred to as "a resin in an uncured state") cures by being given curing energy. As the curing energy, an electromagnetic wave or heat is used. A wavelength of the electromagnetic wave is selected from the range of 10 nm or more and 1 mm or less. Lights having such a wavelength include infrared light, visible light, and ultraviolet light.

The curable composition cures by being irradiated with light or being heated. A light-curable composition that cures by being irradiated with light contains at least a polymerizable compound and a photopolymerization initiator, and may contain a non-polymerizable compound or a solvent, where necessary. The non-polymerizable compound is at least one type selected from a group of a sensitizer, a hydrogen donor, an internal mold release agent, a surfactant, an antioxidant, and a polymer component.

The imprint material may be applied in a form of a film onto the substrate by a spin coater or a slit coater. Alternatively, the imprint material may be applied in a form of a droplet or in a form of an island or a film formed by connecting a plurality of droplets, onto the substrate by a liquid injection head. A viscosity (viscosity at 25° C.) of the imprint material is, for example, 1 mPa·s or more and 100 mPa·s or less.

As the substrate, glass, a ceramic, a metal, a semiconductor, or a resin is used. On the surface of the substrate, a member composed of a different material from the substrate may be formed, where necessary. Specifically, examples of the substrate include a silicon wafer, a compound semiconductor wafer, and quartz glass.

In the present exemplary embodiment, the imprint apparatus 1 employs a light curing method as a curing method for curing the imprint material. As illustrated in FIG. 1, a direction parallel to the optical axis of an illuminator that emits light to the imprint material on the substrate is defined as a Z-axis. Directions orthogonal to each other in a plane perpendicular to the Z-axis are defined as an X-axis and a Y-axis.

The imprint apparatus 1 includes an illuminator 2 (a first illuminator), a mold holding mechanism 3, a substrate stage 4, a scanning light illuminator 5 (a second illuminator), a controller 6, and an alignment measurer 7. The imprint apparatus 1 also includes a base surface plate 8, a bridge surface plate 9, and support columns 11. On the base surface plate 8, the substrate stage 4 is placed. The mold holding mechanism 3 is fixed to the bridge surface plate 9. The support columns 11 extend from the base surface plate 8 and support the bridge surface plate 9 through vibration eliminators 10. The vibration eliminators 10 reduce (eliminate) vibrations transmitted from a floor surface to the bridge surface plate 9. The imprint apparatus 1 also includes a mold conveyor (not illustrated) that conveys a mold 12 from outside to the mold holding mechanism 3, and a substrate conveyor (not illustrated) that conveys a substrate 13 from outside to the substrate stage 4.

The illuminator 2 emits, in the imprint process, ultraviolet light 17 for curing an imprint material 14 to the imprint material 14 on the substrate 13 through a masking blade 15 (a light-shielding member), a dichroic mirror 16, and the mold 12. The illuminator 2 includes a light source, and an optical element. The light source emits light of a wavelength of, for example, 400 nm. The optical element adjusts the ultraviolet light 17 emitted from the light source to be suitable for the imprint process. The masking blade 15 is a light-shielding plate for limiting the irradiation range of the ultraviolet light 17 emitted from the illuminator 2 to the substrate 13. As details are described below, the masking blade 15 is located between the mold 12 and the illuminator 2 (the light source), and thereby the masking blade 15 can adjust the irradiation range of the ultraviolet light 17 to a rectangular shape. An irradiation region of the masking blade 15 is provided such that the irradiation region of the masking blade 15 can be appropriately adjusted. When exposure is performed, the ultraviolet light 17 from the illuminator 2 is collectively emitted to an irradiation region determined by the position of the masking blade 15.

The mold 12 has a polygonal (rectangular) outer peripheral shape. Near the center of the surface of the mold 12 opposed to the substrate 13, a portion (a protruding portion 18, also referred to as a "mesa portion") protruding further than a base portion 12b around the protruding portion 18 is provided. A region of the protruding portion 18 then comes into contact with the imprint material 14, whereby the imprint process is performed.

Figure 2A:
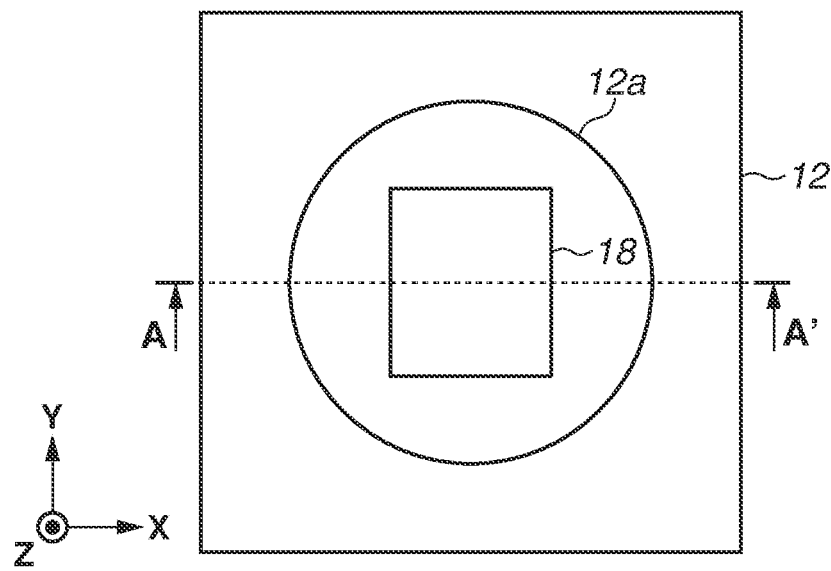
FIG. 2A is a plan view of a mold viewed in a Z-axis direction.
Figure 2B:
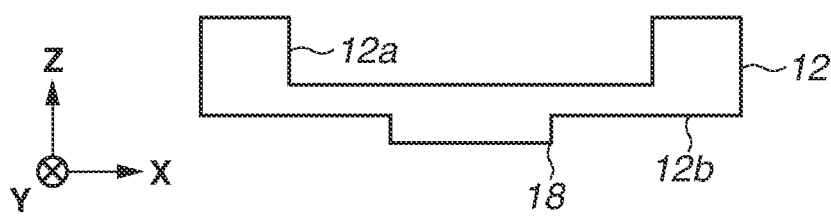
FIG. 2B is an A-A' cross section of the mold illustrated in FIG. 2A.
Figure 2C:
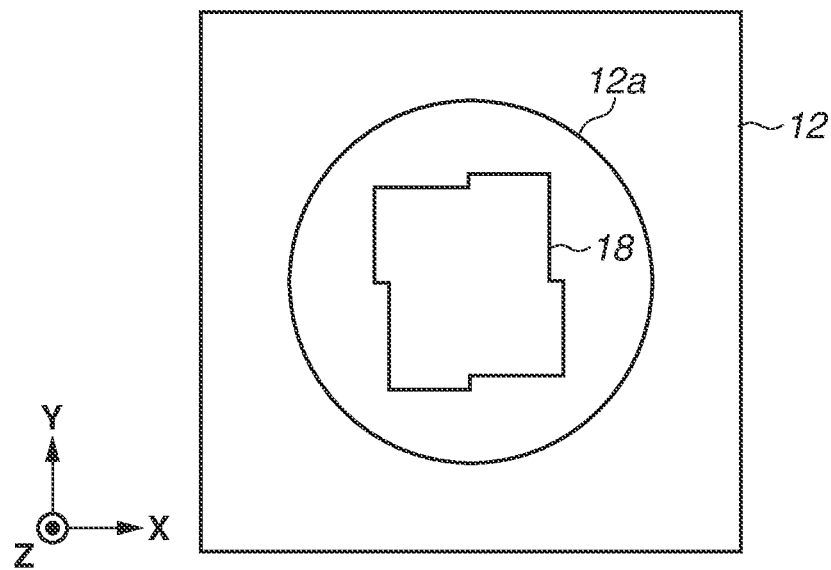
FIG. 2C is a plan view of a mold having a shape of a pattern region different from a shape of a pattern region illustrated in FIG. 2A, viewed in the Z-axis direction.

FIG. 2A is a plan view of the mold 12 viewed in the Z-axis direction. FIG. 2B is an A-A' cross section of the mold 12 illustrated in FIG. 2A. In the protruding portion 18 of the mold 12, an uneven pattern to be transferred to the substrate 13, such as a circuit pattern, is three-dimensionally formed. The mold 12 is composed of a material, such as quartz, that can transmit the ultraviolet light 17. On a surface of the mold 12 (a surface where the ultraviolet light 17 is incident) opposite to the surface opposed to the substrate 13, a cavity 12a (a recessed portion) that facilitates the deformation of the mold 12 (the protruding portion 18) is provided. The cavity 12a has a circular planar shape, and the depth of the cavity 12a is appropriately set according to the size and the material of the pattern portion 18 (the protruding portion 18). The cavity 12a is provided such that the cavity 12a is a region broader than the protruding portion 18 when viewed in the Z-axis direction. The protruding portion 18 is placed to be located in a center portion of the cavity 12a. As an outer shape of the protruding portion 18 viewed in the Z-axis direction, various shapes can be employed, such as a rectangular shape as illustrated in FIG. 2A, and a polygonal shape as illustrated in FIG. 2C. The outer shape of the protruding portion 18 can be appropriately determined according to a type of the article to be manufactured or a manufacturing step.

The mold holding mechanism 3 includes a mold holder 19 that holds the mold 12, and a mold driver 20 that moves the mold 12 (the mold holder 19) by holding the mold holder 19.

The mold holder 19 holds the mold 12 by attracting, with a vacuum suction force or an electrostatic force, an outer peripheral region on the surface of the mold 12 on the side where the ultraviolet light 17 is incident. For example, in a case where the mold holder 19 holds the mold 12 with a vacuum suction force, the mold holder 19 is connected to a vacuum pump installed outside. The vacuum pump is turned on and off, thereby switching the attachment and detachment (holding and release of the holding) of the mold 12.

The mold driver 20 moves the mold 12 in the Z-axis direction to bring the imprint material 14 on the substrate 13 and the protruding portion 18 of the mold 12 into contact with each other (a contact process) or pull away the protruding portion 18 of the mold 12 from the imprint material 14 on the substrate 13 (a release process) in a selective manner Examples of an actuator applicable to the mold driver 20 include a linear motor, and an air cylinder. To position the mold 12 with high accuracy, the mold driver 20 may include a plurality of driving systems, such as a coarse driving system and a fine driving system. The mold driver 20 is configured to move the mold 12 not only in the Z-axis direction but also in the X-axis direction and the Y-axis direction. The mold driver 20 may also have a tilt function for adjusting a position of the mold 12 in a θ (rotation about the Z-axis) direction and a tilt of the mold 12.

The contact process and the release process performed by the imprint apparatus 1 may be achieved by moving the mold 12 in the Z-axis direction as in the present exemplary embodiment, but may be achieved by moving the substrate 13 (the substrate stage 4) in the Z-axis direction. Alternatively, the contact process and the release process may be achieved by moving both the mold 12 and the substrate 13 relative to each other in the Z-axis direction.

The mold holder 19 and the mold driver 20 include an opening 21 in their center portions (inside) so that the ultraviolet light 17 from a illumination system (the illuminator 2) is emitted to the imprint material 14 on the substrate 13. In the opening 21, a light transmission member 22 is placed. The light transmission member 22 seals a space surrounded by a part of the opening 21 and the cavity 12a of the mold 12. The pressure within the sealed space is adjusted by a pressure adjustment device, such as a vacuum pump. For example, when the imprint material 14 on the substrate 13 and the mold 12 are brought into contact with each other, the pressure adjustment device makes the pressure within the sealed space higher than the outside pressure and bends (deforms) the pattern portion 18 of the mold 12 into a protruding shape toward the substrate 13. This can bring the pattern portion 18 of the mold 12 into contact with the imprint material 14 placed on the substrate 13 from a center portion of the pattern portion 18. Thus, air is prevented from remaining between the mold 12 and the imprint material 14, and every corner of the uneven pattern of the protruding portion 18 of the mold 12 can be filled with the imprint material 14. The protruding portion 18 of the mold 12 thereby forms a pattern on the imprint material 14 on the substrate 13.

The substrate stage 4 is used to align the mold 12 and the substrate 13 when the substrate 13 is hold and the imprint material 14 on the substrate 13 and the mold 12 are brought into contact with each other. The substrate stage 4 includes a substrate holder 23, and a stage driver 24; the substrate holder 23 suctions and holds the substrate 13, and the stage driver 24 can move the substrate holder 23 in each axis direction by mechanically holding the substrate holder 23.

Examples of an actuator applicable to the stage driver 24 include a linear motor and a planar motor. To position the substrate 13 with high accuracy, the stage driver 24 may include a plurality of driving systems, such as a coarse driving system and a fine driving system, for each direction of the X-axis and Y-axis. The stage driver 24 may be configured to move the substrate 13 not only in the X-axis direction and the Y-axis direction but also in the Z-axis direction. The stage driver 24 may also have a tilt function for adjusting the position of the substrate 13 in a θ (rotation about the Z-axis) direction and the tilt of the substrate 13.

On a side surface of the substrate stage 4, an encoder system 25 is placed corresponding to the X-axis, Y-axis, and Z-axis directions. The encoder system 25 emits a beam from an encoder head 26 to an encoder scale 27, thereby measuring the position of the substrate stage 4. The encoder system 25 measures the position of the substrate stage 4 in real time. Based on the measured value of the encoder system 25, the controller 6 positions the substrate stage 4.

The scanning light illuminator 5 (the second illuminator) emits beam-like ultraviolet light 29 to a desired position on the substrate 13 through a dichroic mirror 28 while scanning the beam-like ultraviolet light 29, thereby curing the imprint material 14.

Figure 3:
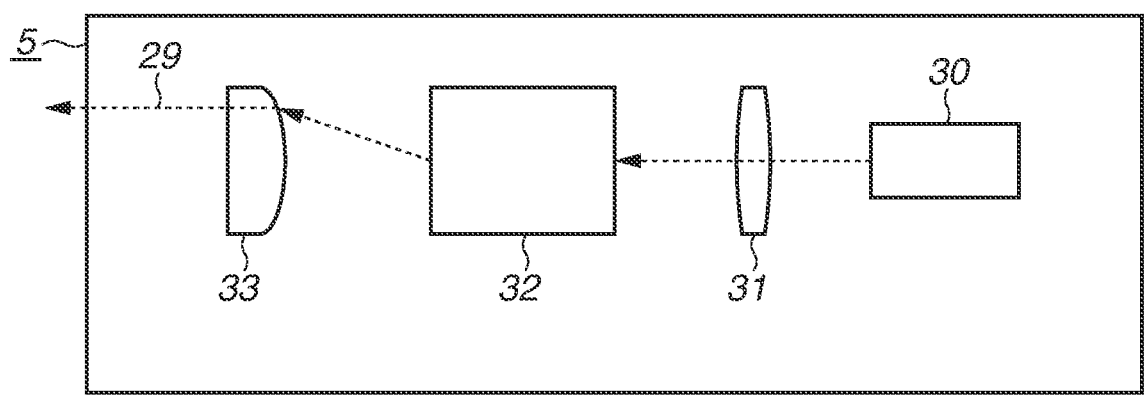
FIG. 3 is a block diagram illustrating a scanning light illuminator according to the present invention.

FIG. 3 is a block diagram illustrating a configuration of the scanning light illuminator 5. A light source 30 emits light of a wavelength for curing the imprint material 14. The wavelength of the light is, for example, 400 nm. In the present exemplary embodiment, the light source 30 of the scanning light illuminator 5 uses a light source different from the light source of the illuminator 2. Alternatively, the scanning light illuminator 5 and the illuminator 2 may use light from a common light source and emit the light to the imprint material 14.

The spot shape of the light emitted from the light source 30 is adjusted to a beam-like shape by an optical element 31, and the light is guided to a scanning element 32 (a scanner). The scanning element 32 is a scanning mechanism for scanning the beam light emitted from the optical element 31 in the XY-plane direction. A beam-like ultraviolet light 29 scanned by the scanning element 32 is emitted onto the imprint material 14 on the substrate 13 through an optical element 33, and thereby curing the imprint material 14. As the scanning element 32, for example, a galvanometer scanner or a microelectromechanical systems (MEMS) mirror device can be used.

The controller 6 is composed of a computer including a central processing unit (CPU) and a memory. The controller 6 controls the components of the imprint apparatus 1 according to a program stored in the memory. The controller 6 controls operations and adjustments of the components included the imprint apparatus 1, thereby controlling the imprint process for forming a pattern on a substrate. Further, in the present exemplary embodiment, the controller 6 controls an irradiation region adjusted by the masking blade 15 and the scanning of beam-like light emitted by the scanning light illuminator 5 according to the type of the mold 12 (the shape of the protruding portion 18) held by the mold holder 19. The controller 6 may be formed integrally (in a common housing) with another portion of the imprint apparatus 1, or may be formed separately (in a different housing) from another portion of the imprint apparatus 1.

When the imprint process is performed, the alignment measurer 7 emits alignment light 34 to the mold 12 and the substrate 13 and detects the alignment light 34 reflected by the mold 12 and the substrate 13, thereby measuring the amount of the relative positional shift between the mold 12 and the substrate 13. The amount of the relative positional shift measured at this time is used to reduce the positional shift by adjusting the mold driver 20 and the stage driver 24. The positional shift can also be reduced by a shape corrector (not illustrated) deforming the shape of the protruding portion 18 of the mold 12 or an imprint region on the substrate 13.

In the present exemplary embodiment, the imprint material 14 is supplied onto the entire surface of the substrate 13 in advance before the substrate 13 is carried into the imprint apparatus 1. Alternatively, a supplier may be provided in the imprint apparatus 1 and supply (apply) the uncured imprint material 14 onto the substrate 13. At this time, the imprint material 14 may be collectively supplied (applied) onto the entire surface of the substrate 13, or may be supplied (applied) onto each region on the substrate 13 to be subjected to the imprint process.

Figure 4:
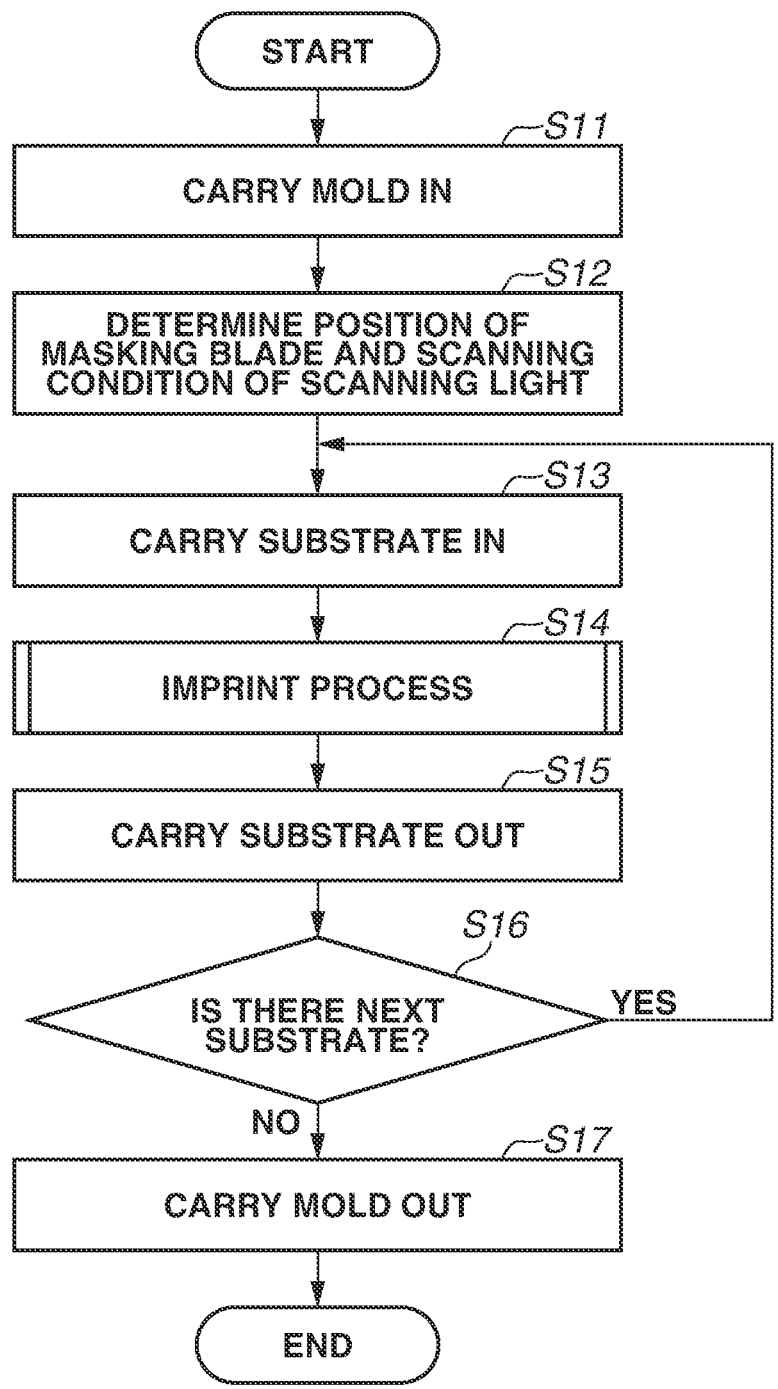
FIG. 4 is a flowchart illustrating a processing flow of an imprint apparatus according to a first exemplary embodiment.
Figure 5:
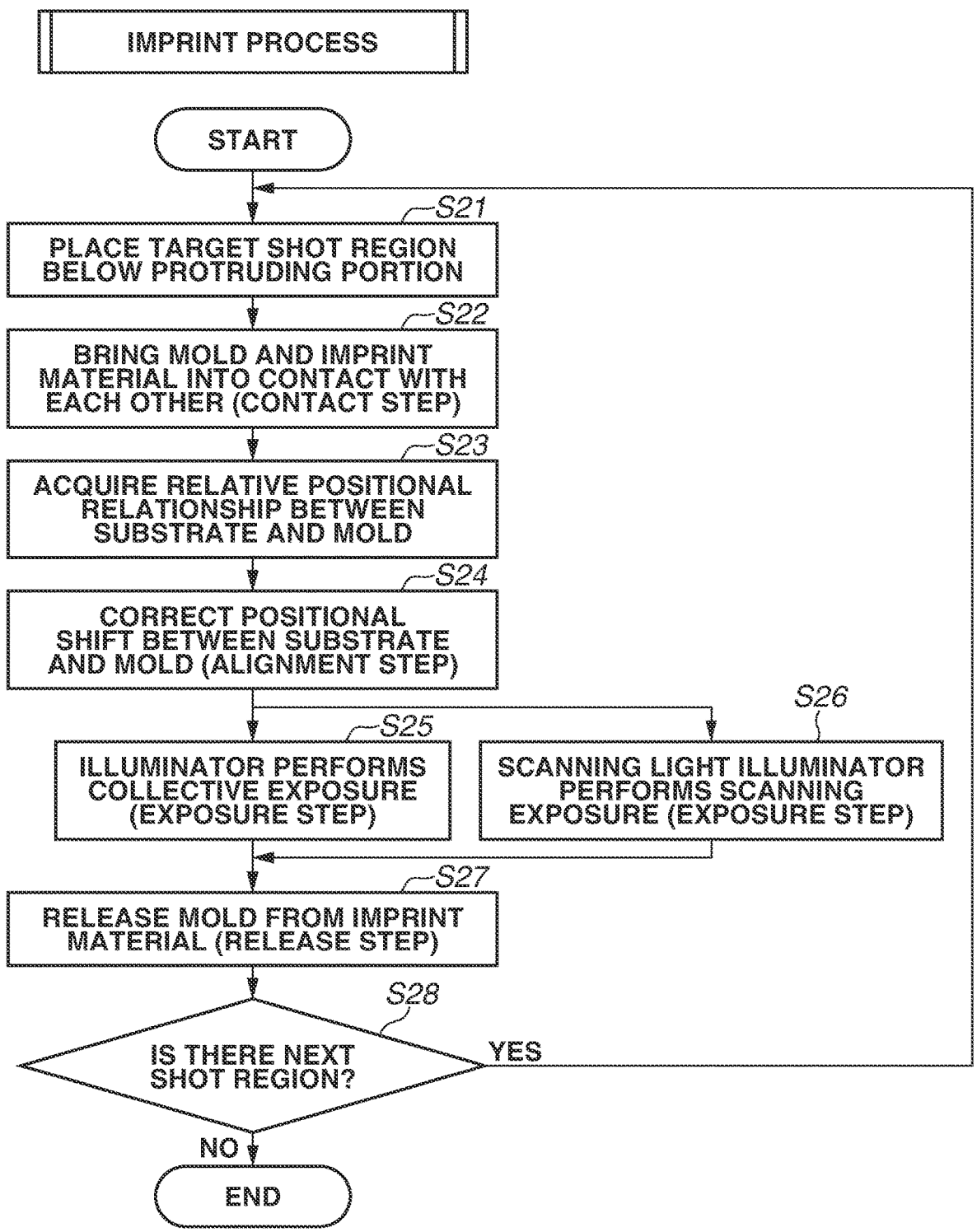
FIG. 5 is a flowchart illustrating a flow of an imprint process according to the first exemplary embodiment.

Next, a description is given of the imprint process using the imprint apparatus 1 according to the present exemplary embodiment with reference to FIGS. 4 and 5. FIG. 4 is a flowchart illustrating the processing flow of the imprint apparatus 1 when the mold 12 is loaded onto and unloaded from the imprint apparatus 1. FIG. 5 is a flowchart illustrating the imprint process flow for forming a pattern performed in step S14 in FIG. 4. This processing is performed by the controller 6 performing overall control of the components of the imprint apparatus 1.

In step S11, the controller 6 controls an external mold conveyor (not illustrated) to convey the mold 12 to the mold holding mechanism 3. The controller 6 controls the mold holder 19 to hold the mold 12 in a suction manner (mold loading).

In step S12, the controller 6 determines and adjusts the position of the masking blade 15 to the position (an irradiation region) of the masking blade 15 according to the type of the mold 12 loaded in step S1. The controller 6 then determines the scanning condition of the scanning light illuminator 5 according to the irradiation region. Specifically, the controller 6 identifies a type of the loaded mold 12 and a shape of the protruding portion 18 of this type by referencing a memory (a storage) provided in the imprint apparatus 1 based on the serial number of the mold 12 carried into the imprint apparatus 1 and a production recipe selected by a user. The controller 6 then determines the position (the amount of adjustment) of the masking blade 15 that results in a region certainly narrower than a region of the protruding portion 18 of the identified mold 12. The controller 6 further determines a scanning condition such that a region of the protruding portion 18 to which light is not emitted because the light is blocked by the masking blade 15 is scanned with light from the scanning light illuminator 5. That is, the scanning condition of the scanning light illuminator 5 is determined according to the amount of light blocked by the masking blade 15.

Figure 7A:
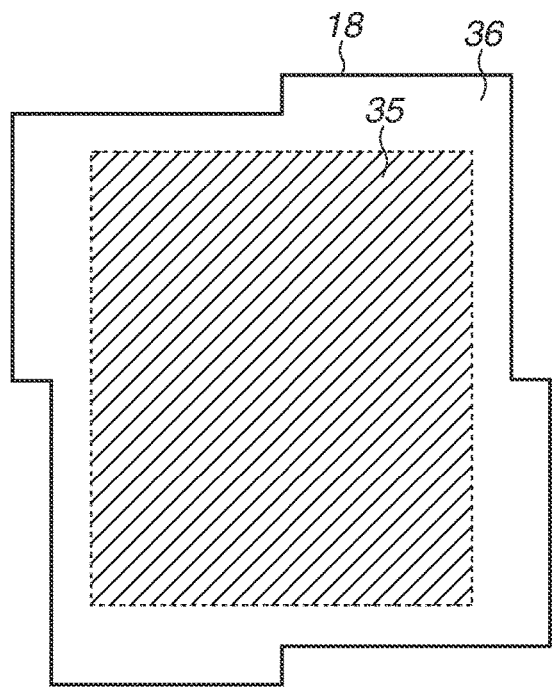
FIG. 7A is a diagram illustrating an irradiation region for collective exposure and an irradiation region for scanning exposure in the pattern region illustrated in FIG. 2C.

FIG. 6A is a diagram illustrating an irradiation region 35 (a first region) and a scanning region 36 (a second region) that are determined in step S12 in the case of the shape of the protruding portion 18 as illustrated in FIG. 2A. A scanning trajectory 29a illustrated in FIG. 6B is a trajectory along which the beam-like ultraviolet light 29 emitted from the scanning light illuminator 5 is scanned. FIG. 7A is a diagram illustrating an irradiation region 35 and a scanning region 36 that are determined in step S12 in the case of the shape of the protruding portion 18 as illustrated in FIG. 2C. In an example of FIG. 7B, the scanning condition is determined such that the scanning light illuminator 5 stops emitting light while scanning the scanning region 36 along a scanning trajectory 29b, and the scanning light illuminator 5 emits light while scanning the scanning region 36 along the scanning trajectory 29a.

Figure 7B:
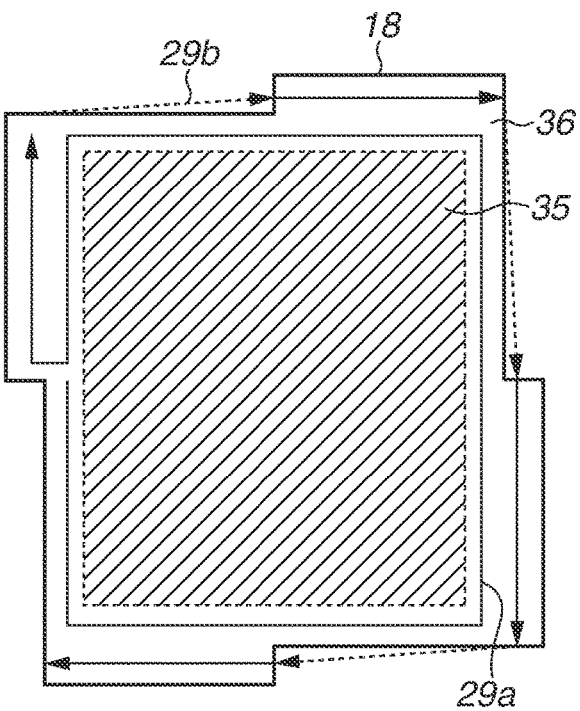
FIG. 7B is a diagram illustrating a state of the scanning exposure in the scanning area illustrated in FIG. 7A.
Figure 7C:
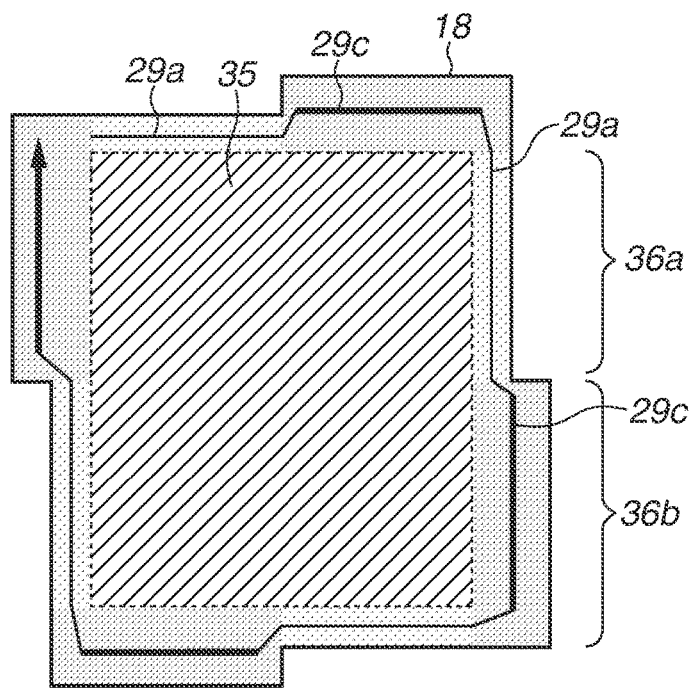
FIG. 7C is a diagram illustrating a state of the scanning exposure in the scanning area illustrated in FIG. 7A.

In the examples of FIGS. 6B and 7B, the beam shape of the scanning light illuminator 5 is always constant. Alternatively, the beam shape of the scanning light illuminator 5 may be changed during the scanning. The optical element 31 may be controlled, thereby adjusting the size of the spot shape and adjusting the width at which exposure is performed. That is, as illustrated in FIG. 7C, in the case of the protruding portion 18 where the scanning region 36 includes a scanning region 36a having a small exposure width and a scanning region 36b having a large exposure width, the scanning condition is determined such that the scanning region 36a is scanned along the scanning trajectory 29a in a state where the spot shape is controlled to be small. Then, the scanning region 36b is scanned along a scanning trajectory 29c in a state where the spot shape is changed to a size twice that of the scanning region 36a. At this time, the amount of light per unit area decreases according to the increase in the spot shape of the ultraviolet light 29. Thus, it is desirable to perform control to make the amount of light per unit area constant by increasing the amount of light of the light source 30 of the scanning light illuminator 5 or decreasing the scanning speed of the scanning element 32.

FIGS. 6B, 7B, and 7C illustrate examples of the scanning trajectory 29a where exposure is performed by scanning all the way around the scanning region 36 provided around the irradiation region 35 with the ultraviolet light 29. Alternatively, the scanning condition may be determined such that the ultraviolet light 29 may travel back and forth multiple times. The adjustment of the position of the masking blade 15 and the determination of the scanning condition do not necessarily need to be made before the substrate 13 is carried into the imprint apparatus 1, and only need to be made before exposure steps in steps S25 and S26.

In step S13, the controller 6 controls an external substrate conveyor (not illustrated) to convey the substrate 13 to the substrate stage 4 and controls the substrate holder 23 to hold the substrate 13 in a suction manner (substrate loading). Onto the entire surface of the substrate 13 carried into the imprint apparatus 1 at this time, the imprint material 14 is supplied (applied) in advance by a processor (not illustrated).

In step S14, the controller 6 executes the imprint process.

In step S15, the controller 6 controls the external substrate conveyor to carry the substrate 13 out of the substrate stage 4 (substrate unloading).

In step S16, the controller 6 determines whether there is a substrate to be processed next. If there is a substrate to be processed (YES in step S16), the processing returns to step S13. If there is not a substrate to be processed (NO in step S16), the processing proceeds to step S17.

In step S17, the controller 6 controls the external mold conveyor to carry the mold 12 out of the mold holding mechanism 3 (mold unloading), and the processing ends.

In step S21, the controller 6 controls at least one of the substrate stage 4 and the mold driver 20 to be driven such that a shot region on the substrate 13 to be subjected to the imprint process from now is located below the protruding portion 18 of the mold 12.

In step S22, the controller 6 brings the protruding portion 18 of the mold 12 and the imprint material 14 on the substrate 13 into contact with each other (a contact step). Specifically, the controller 6 drives the mold driver 20 in the Z-axis direction while adjusting the pressure within the space formed by the cavity 12a, thereby bringing the protruding portion 18 of the mold 12 and the imprint material 14 on the substrate 13 into contact with each other so that air bubbles do not remain. At this time, it is desirable to press the protruding portion 18 of the mold 12 and the imprint material 14 on the substrate 13 against each other while making an adjustment so that the uneven pattern of the protruding portion 18 is filled with the imprint material 14.

In step S23, the controller 6 controls the alignment measurer 7 to measure the relative positional relationship between alignment marks provided in the substrate 13 and the mold 12.

In step S24, the controller 6 controls at least one of the substrate stage 4 and the mold driver 20 to be driven such that the relative positional shift acquired in step S23 is reduced, thereby making the position adjustment of the substrate 13 and the mold 12 (an alignment step).

In step S25, the controller 6 controls exposure such that the ultraviolet light 17 from the illuminator 2 is emitted through the masking blade 15 positioned in step S12 (an exposure step). Specifically, the illuminator 2 collectively exposes the irradiation region 35 as illustrated in FIG. 6B, 7B, or 7C, thereby curing the imprint material 14 applied in a region in contact with the irradiation region 35 of the protruding portion 18.

In step S26, the controller 6 controls the scanning element 32 to scan the ultraviolet light 29 from the scanning light illuminator 5 (an exposure step). Specifically, the controller 6 scans the beam-like ultraviolet light 29 along the scanning trajectory 29a, 29b, or 29c as illustrated in FIG. 6B, 7B, or 7C, thereby curing the imprint material 14 applied in a region in contact with the scanning region 36 of the protruding portion 18.

As illustrated in the flowchart in FIG. 5, steps S25 and S26 are performed in parallel processing, whereby it is possible to shorten the time required for the imprint process. Alternatively, steps S25 and S26 may be sequentially performed.

In step S27, the controller 6 releases the protruding portion 18 of the mold 12 from the cured imprint material 14. Specifically, the controller 6 drives the mold driver 20 in the Z-axis direction while adjusting the pressure within the space formed by the cavity 12a, thereby releasing the mold 12 from the imprint material 14.

As described above it is possible to always expose an exposure range according to the shape of the protruding portion 18 by controlling the position of the masking blade 15 and the scanning trajectory of the scanning light illuminator 5, according to the type of the mold 12 held by the mold holder 19, particularly according to the shape of the protruding portion 18 of the mold 12. That is, it is possible to easily prevent the emission of ultraviolet light to the imprint material 14 outside the protruding portion 18 even if the unique masking blade 15 is not provided for each shape of the protruding portion 18 of the mold 12 to be used. Thus, it is possible to achieve an imprint process with high reliability.

In the first exemplary embodiment, the description has been given on the assumption that, when exposure is performed, the filling of the uneven pattern with the imprint material has been completed on the entire surface of the imprint region, without consideration of the speed of filling the uneven pattern with the imprint material. In a second exemplary embodiment, a description is given of scanning exposure in a case where a time lag occurs in the filling with the imprint material. In the present exemplary embodiment, the differences from the first exemplary embodiment are described, and similarities to the first exemplary embodiment are omitted.

Figure 8:
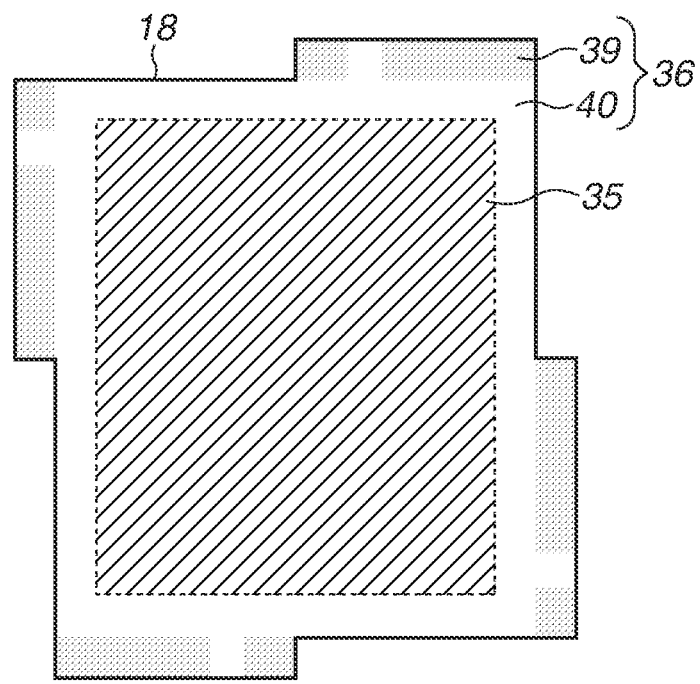
FIG. 8 is a diagram illustrating a protruding portion in a case where there is a difference in a filling speed.

As described in the first exemplary embodiment, the protruding portion 18 of the mold 12 includes a region where an uneven pattern to be formed on the imprint material 14 is provided, but also includes a flat region where an uneven pattern is not provided. In such a flat region or a region having an uneven pattern but having a wide pattern pitch, it can be said that the speed of filling with the imprint material 14 is high, and the filling is completed early when the protruding portion 18 and the imprint material 14 are brought into contact with each other. FIG. 8 illustrates a case where the scanning region 36 of the protruding portion 18 includes a region 39 that is quickly filled (a region that is easy to fill) and a region 40 that is slowly filled (a region that is difficult to fill).

The region 39 that is thus quickly filled with the imprint material 14 can be said to be a region that can be exposed even before the filling of the entire surface of the imprint region with the imprint material 14 is completed. Thus, the exposure of this region is started before the filling of the entire surface with the imprint material 14 is completed, whereby it is possible to shorten the time required for the imprint process.

Figure 9:
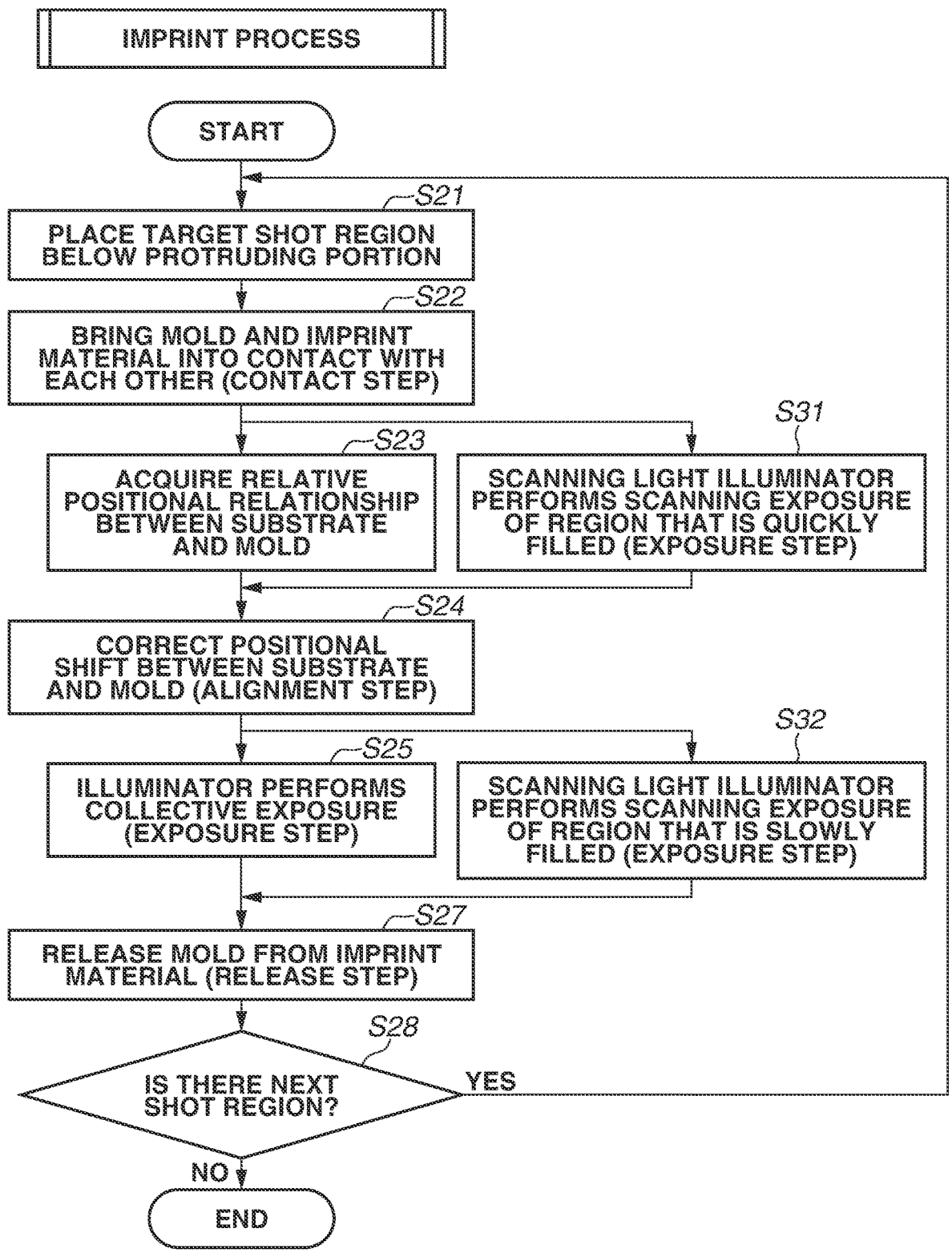
FIG. 9 is a flowchart illustrating a flow of an imprint process according to a second exemplary embodiment.

FIG. 9 is a flowchart illustrating the flow of the process for forming a pattern according to the present exemplary embodiment. This processing is performed by the controller 6 performing overall control of the components of the imprint apparatus 1. Steps S21 to S25, S27, and S28 in the flow illustrated in FIG. 9 are similar to those in the first exemplary embodiment, and therefore are omitted.

In the present exemplary embodiment, the imprint apparatus 1 includes a memory (a storage); the memory holds information that allows the identification of whether the region 39 that is quickly filled with the imprint material 14 exists in the mold 12 carried into the imprint apparatus 1 in step S11, and the identification of which position the region 39 is provided at if the region 39 exists. In step S12 in FIG. 4, the controller 6 also identifies information indicating whether the region 39 that is quickly filled exists in the mold 12, when the controller 6 identifies the type of the mold 12 and the shape of the protruding portion 18 based on the serial number of the mold 12 carried into the imprint apparatus 1 and the production recipe. In step S12, the controller 6 determines the position of the masking blade 15 that results in a region certainly narrower than the identified region of the protruding portion 18 of the mold 12. The controller 6 then determines the scanning condition such that a region of the protruding portion 18 to which light is not emitted because the light is blocked by the masking blade 15 is scanned with light from the scanning light illuminator 5. At this time, the controller 6 determines the scanning condition such that in the scanning region 36, the region 39 where a filling speed is high is exposed before other region (the region 40 where the speed of filling is low).

In step S31 in FIG. 9, the controller 6 controls the scanning element 32 to scan the region 39, which is quickly filled, with the ultraviolet light 29 emitted from the scanning light illuminator 5 (an exposure step) based on the scanning condition determined in step S12. Generally, the region to be exposed in this step is a flat region where the uneven pattern of the protruding portion 18 does not exist, and therefore the region can also be a region that does not require alignment with accuracy. Thus, if it is after the contact step is started, the exposure step can be started to such an extent that the imprint material 14 is not completely cured, as long as the filling of this region is completed even before the alignment step illustrated in step S24 is completed (during the alignment).

In step S32, the controller 6 controls the scanning element 32 to scan the region 40, which is slowly filled, with the ultraviolet light 29 emitted from the scanning light illuminator 5 (an exposure step), based on the scanning condition determined in step S12.

That is, also in the present exemplary embodiment, it is possible to always expose an exposure range according to the shape of the protruding portion 18 by controlling the position of the masking blade 15 and the scanning trajectory of the scanning light illuminator 5, based on the type of the mold 12 held by the mold holder 19, particularly based on the shape of the protruding portion 18 of the mold 12. That is, it is possible to easily prevent the emission of ultraviolet light to the imprint material 14 outside the protruding portion 18, even if the unique masking blade 15 is not provided for each shape of the mold 12 to be used. Thus, it is possible to achieve an imprint process with high reliability. Further, according to the present exemplary embodiment, the exposure of the region 39, which is quickly filled, can be started in advance even before the filling of the entire surface of the protruding portion 18 is completed. Thus, it is possible to shorten the time required for the imprint process.

Regarding Manufacturing of Article

The pattern of a cured product formed by the imprint apparatus 1 is permanently used in at least a part of each of various articles, or temporarily used to manufacture each of various articles.

Examples of the article include an electric circuit element, an optical element, MEMS, a recording element, a sensor, and a mold. Examples of the electric circuit element include volatile or non-volatile semiconductor memories, such as a dynamic random-access memory (DRAM), a static random-access memory (SRAM), a flash memory, and a magnetoresistive random-access memory (MRAM), and semiconductor devices, such as a large-scale integration (LSI) device, a charge-coupled device (CCD), an image sensor, and a field-programmable gate array (FPGA). Examples of the mold include a mold for imprint.

The pattern of the cured product is used as it is as a component member of at least a part of the article, or temporarily used as a resist mask. After etching or ion implantation is performed in the step of processing a substrate, the resist mask is removed.

Next, a description will be given, with reference to FIG. 10, of a method for manufacturing an article in which a pattern is formed on a substrate using an imprint apparatus, the substrate on which the pattern is formed is processed, and an article is manufactured from the processed substrate. In step SA, a substrate 1z such as a silicon wafer, on the surface of which a processing target material 2z such as an insulator is formed, is prepared. To the surface of the processing target material 2z, an imprint material 3z is applied by, for example, an inkjet method. Step SA illustrates a state where the imprint material 3z is applied onto the substrate 1z in a form of a plurality of droplets.

In step SB, the side of a mold 4z for imprint where an uneven pattern is formed is directed and opposed to the imprint material 3z applied on the substrate 1z. In step SC, the substrate 1z onto which the imprint material 3z is applied and the mold 4z are brought into contact with each other, and pressure is applied to the imprint material 3z and the mold 4z. The imprint material 3z fills the gap between the mold 4z and the processing target material 2z. If light as curing energy is emitted to the imprint material 3z through the mold 4z in this state, the imprint material 3z cures.

In step SD, after the imprint material 3z is cured, the pattern of a cured product of the imprint material 3z is formed on the substrate 1z after the mold 4z and the substrate 1z are pulled away from each other. This pattern of the cured product has such a shape that a recessed portion of the mold 4z corresponds to a protruding portion of the cured product, and a protruding portion of the mold 4z corresponds to a recessed portion of the cured product. That is, the uneven pattern of the mold 4z has been transferred to the imprint material 3z.

In step SE, if etching is performed using the pattern of the cured product as an etching-resistant mask, then in the surface of the processing target material 2z, a portion where the cured product is not present or thinly remains is removed, thereby forming grooves 5z. In step SF, after the pattern of the cured product is removed, an article in which the grooves 5z are formed on the surface of the processing target material 2z can be obtained. In this case, the pattern of the cured product is removed. Alternatively, even after the processing, the pattern of the cured product may not be removed, and may be used as, for example, an interlayer insulating film included in a semiconductor device, i.e., a component member of the article.

The method for manufacturing an article also includes the step of forming a pattern on an imprint material supplied (applied) onto a substrate using the imprint apparatus (the imprint method), and the step of processing the substrate on which the pattern is formed in the above step. This manufacturing method also includes other known processes (oxidation, film formation, deposition, doping, planarization, etching, resist removal, dicing, bonding, and packaging). It can be said that the method for manufacturing an article according to the present exemplary embodiment has an advantage over a conventional method in at least one of the performance, the quality, the productivity, and the production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-194555, filed Oct. 25, 2019, which is hereby incorporated by reference herein in its entirety.

What is claimed is:

1. An imprint apparatus that uses a mold including a protruding portion protruding from a base portion to perform an imprint process for bringing the protruding portion into contact with a composition on a substrate, the imprint apparatus comprising:
   a mold holder having structure configured to direct a force to the mold that holds the mold;
   a substrate holder configured to be moved by a stage driver and having an upper surface that supports the substrate;
   a driving system having a motor configured to drive at least one of the substrate and the mold so that the protruding portion of the mold is in contact with the composition on the substrate;

a first illuminator having a light source configured to emit light for curing the composition;

a second illuminator including a scanner configured to scan a light beam for curing the composition so that an irradiation position of the light beam moves along a scanning trajectory on a plane of the substrate; and a controller configured to control, wherein, in a state where the composition and the protruding portion are in contact with each other, the controller is configured to control the exposure such that the light from the first illuminator is emitted to the composition at a position corresponding to a first region of the protruding portion, and to control the scanner such that the light from the second illuminator is emitted to the composition at a position corresponding to a second region of the protruding portion, and wherein the second region is provided around the first region and the scanning trajectory is a trajectory that circulates around at least the second region provided around the first region.

2. The imprint apparatus according to claim 1, further comprising a light-shielding plate located at a position between the mold and the first illuminator and configured to block the light from the first illuminator, wherein the first region is determined based on an amount of light blocked by the light-shielding plate.

3. The imprint apparatus according to claim 2, wherein the controller controls the scanner according to the amount of light blocked by the light-shielding plate.

4. The imprint apparatus according to claim 1, wherein the second illuminator is a scanning light illuminator, and wherein the controller is configured to determine conditions of the scanning light illuminator in accordance with a type of the mold loaded and held by the mold holder and controls the scanner to be scanned based on the determined conditions.

5. The imprint apparatus according to claim 1, wherein the controller controls the first illuminator to emit light and controls the second illuminator to emit light in parallel with light emitted from the first illuminator.

6. The imprint apparatus according to claim 1, wherein the second region of the protruding portion of the mold includes a plurality of regions with different speed of filling with the composition when the protruding portion is brought into contact with the composition, and wherein, among the plurality of regions included in the second region, the controller controls the scanner such that the light from the second illuminator is emitted in order from a first region having a speed of filling with the composition that is higher than a speed of filling with the composition of a second region.

7. The imprint apparatus according to claim 1, wherein the second region is provided around the first region.

8. A method for manufacturing an article, the method comprising:

performing the imprint process on the substrate using the imprint apparatus according to claim 1;

processing the substrate on which the imprint process has been performed; and manufacturing an article from the processed substrate.

9. The imprint apparatus according to claim 1, wherein the mold holder is connected to a vacuum pump and the structure of the mold holder is configured to receive a vacuum suction force from the vacuum pump through the connection and hold the mold by deliver the vacuum suction force to an outer peripheral region on a surface of the mold.

10. The imprint apparatus according to claim 1, wherein the driving system is a plurality of driving systems having at least one of a coarse driving system and a fine driving system for each direction of an X-axis and Y-axis.

11. An imprint method for an imprint apparatus that uses a mold including a protruding portion protruding from a base portion to perform an imprint process for bringing the protruding portion into contact with a composition on a substrate, the imprint method comprising:

bringing the protruding portion and the composition into contact with each other;

emitting first light after the bringing into contact for curing the composition to the composition at a position corresponding to a first region of the protruding portion; and emitting second light after the bringing into contact for scanning and emitting a light beam for curing the composition so that an irradiation position of the light beam moves along a scanning trajectory on a plane of the substrate, to the composition at a position corresponding to a second region of the protruding portion, wherein the second region is provided around the first region and the scanning trajectory is a trajectory that circulates around at least the second region provided around the first region.

12. The imprint method according to claim 11, wherein the emitting the first light and emitting the second light are performed in parallel.

* * * * *